(12) United States Patent
Bruurs et al.

(10) Patent No.: US 12,051,607 B2
(45) Date of Patent: Jul. 30, 2024

(54) SUBSTRATE POSITIONING DEVICE WITH REMOTE TEMPERATURE SENSOR

(71) Applicant: ASML NETHERLANDS B.V., Veldhoven (NL)

(72) Inventors: Patriek Adrianus Alphonsus Maria Bruurs, Baarle-Nassau (NL); Dennis Herman Caspar Van Banning, Best (NL); Jan-Gerard Cornelis Van Der Toorn, Eindhoven (NL); Edwin Cornelis Kadijk, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 807 days.

(21) Appl. No.: 17/257,900

(22) PCT Filed: Jun. 27, 2019

(86) PCT No.: PCT/EP2019/067152
§ 371 (c)(1),
(2) Date: Jan. 5, 2021

(87) PCT Pub. No.: WO2020/020564
PCT Pub. Date: Jan. 30, 2020

(65) Prior Publication Data
US 2021/0272829 A1 Sep. 2, 2021

(30) Foreign Application Priority Data

Jul. 24, 2018 (EP) .................................... 18185349
Apr. 12, 2019 (EP) .................................... 19169077

(51) Int. Cl.
*H01L 21/67* (2006.01)
*G01K 1/14* (2021.01)
(Continued)

(52) U.S. Cl.
CPC .......... *H01L 21/67248* (2013.01); *G01K 1/14* (2013.01); *G01K 11/125* (2013.01);
(Continued)

(58) Field of Classification Search
CPC ..... H01L 21/67248; H01L 21/68; G01K 1/14; G01K 11/125; H01J 37/20; H01J 37/244;
(Continued)

(56) References Cited

U.S. PATENT DOCUMENTS 5,835,333 A 11/1998 Castro et al.
6,138,745 A * 10/2000 Moslehi ............ H01L 21/68785
118/728

(Continued)

FOREIGN PATENT DOCUMENTS

JP 2005265700 9/2005
JP 2013074246 4/2013
(Continued)

OTHER PUBLICATIONS

International Search Report and Written Opinion issued in corresponding PCT Patent Application No. PCT/EP2019/067152, dated Nov. 13, 2019.

(Continued)

*Primary Examiner* — Tarifur R Chowdhury
*Assistant Examiner* — Carlos Perez-Guzman
(74) *Attorney, Agent, or Firm* — Pillsbury Winthrop Shaw Pittman, LLP

(57) ABSTRACT

A stage apparatus including: an object table configured to hold an object; a positioning device configured to position the object table and the object held by the object table; and a remote temperature sensor configured to measure a temperature of the object table and/or the object, wherein the remote temperature sensor comprises a passive temperature sensing element.

20 Claims, 15 Drawing Sheets

(51) Int. Cl.
  *G01K 11/125* (2021.01)
  *H01J 37/20* (2006.01)
  *H01J 37/244* (2006.01)
  *H01L 21/68* (2006.01)
(52) U.S. Cl.
  CPC ............ *H01J 37/20* (2013.01); *H01J 37/244* (2013.01); *H01L 21/68* (2013.01); *H01J 2237/20228* (2013.01); *H01J 2237/20235* (2013.01)
(58) Field of Classification Search
  CPC ............. H01J 37/28; H01J 2237/20228; H01J 2237/20235; H01J 2237/2001
  See application file for complete search history.

(56) References Cited

U.S. PATENT DOCUMENTS

| | | | |
|---|---|---|---|
| 2002/0180312 A1* | 12/2002 | Tanaka | G03F 7/70716 310/328 |
| 2004/0130688 A1 | 7/2004 | Emoto | |
| 2005/0167514 A1* | 8/2005 | Kaushal | H01L 21/67248 236/1 C |
| 2006/0255017 A1 | 11/2006 | Markle | |
| 2006/0272772 A1 | 12/2006 | Al-Bayati et al. | |
| 2010/0074604 A1 | 3/2010 | Koelmel et al. | |
| 2016/0363486 A1* | 12/2016 | Yamamoto | G01K 1/14 |
| 2017/0362712 A1 | 12/2017 | Yadav et al. | |
| 2019/0172676 A1* | 6/2019 | Nakano | H01J 37/222 |
| 2019/0182915 A1 | 6/2019 | Hirochi et al. | |

FOREIGN PATENT DOCUMENTS

| | | |
|---|---|---|
| TW | 201721300 | 6/2017 |
| WO | 2018042552 | 3/2018 |

OTHER PUBLICATIONS

Extended European Search Report issued in corresponding European Patent Application No. 18185349.0, dated May 13, 2019.
Taiwanese Office Action issued in corresponding Taiwanese Patent Application No. 108125366, dated May 26, 2020.

* cited by examiner

SUBSTRATE POSITIONING DEVICE WITH REMOTE TEMPERATURE SENSOR

CROSS-REFERENCE TO RELATED APPLICATIONS

This application is the U.S. national phase entry of PCT patent application no. PCT/EP2019/067152, which was filed on Jun. 27, 2019, which claims the benefit of priority of European patent application no. 18185349.0, which was filed on Jul. 24, 2018, and of European patent application no. 19169077.5, which was filed on Apr. 12, 2019, each of which is are incorporated herein in its entirety by reference.

FIELD OF THE INVENTION

The present invention relates to a stage apparatus, an inspection tool and a particle beam apparatus comprising such a stage apparatus.

BACKGROUND ART

The present invention relates to an e-beam inspection tool as can be applied to inspect semiconductor devices.

In semiconductor processes, defects may be generated that may impact device performance and even result in device failure. Device yield may thus be impacted, resulting in cost raise. In order to control semiconductor process yield, defect monitoring is important. One tool useful in defect monitoring is an electron beam inspection system, such as a SEM (Scanning Electron Microscope), which scans a target portion of a specimen using one or more beams of electrons.

In order to accurately inspect a substrate, it may be advantageous to know or estimate a temperature of the substrate or substrate table holding the substrate. Due to the application of a voltage to the substrate table holding the substrate, it may be cumbersome to apply conventional temperature sensors.

SUMMARY OF THE INVENTION

It is an object of the invention to provide an alternative stage apparatus that can be used in a lithographic apparatus, a particle beam apparatus or an inspection tool.

According to an aspect of the invention, there is provided a stage apparatus comprising:
  an object table configured to hold an object;
  a positioning device configured to position the object table;
  a remote temperature sensor configured to measure a temperature of the object table and/or the object,
wherein the remote temperature sensor comprises a passive temperature sensing element.

According to an aspect of the invention, there is provided a particle beam apparatus, an electron beam apparatus, a scanning electron microscope, an electron beam direct writer, an electron beam projection lithography apparatus, an electron beam inspection apparatus, an electron beam defect verification apparatus, an electron beam metrology apparatus, a lithographic apparatus, or a metrology apparatus comprising a stage apparatus according to the invention.

BRIEF DESCRIPTION OF THE DRAWINGS

The present invention will be readily understood by the following detailed description in conjunction with the accompanying drawings, wherein like reference numerals designate like structural elements, and in which.

Figure 1A:
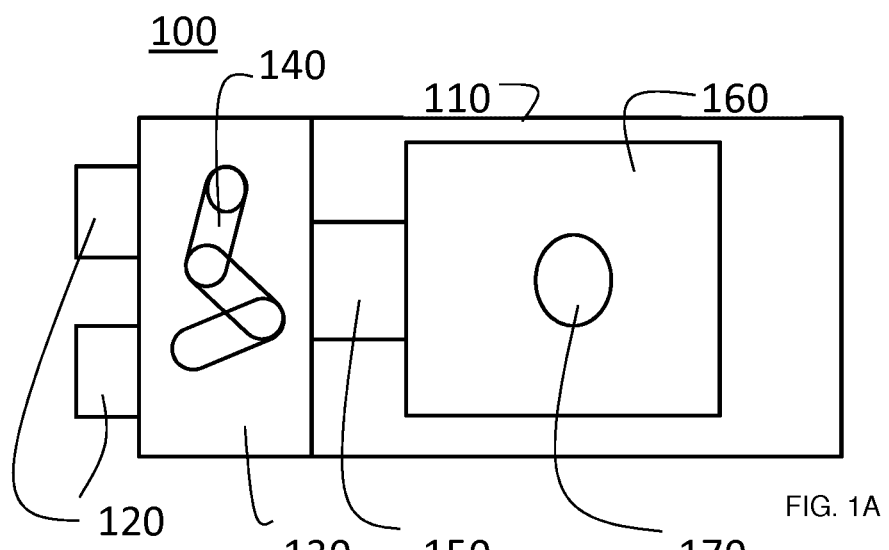
FIGS. 1A and 1B are schematic illustrations of an e-beam inspection tool according to an embodiment of the present invention.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EXAMPLE EMBODIMENTS

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

As used herein, the term "specimen" generally refers to a wafer or any other specimen on which defects of interest (DOI) may be located. Although the terms "specimen" and "sample" are used interchangeably herein, it is to be understood that embodiments described herein with respect to a wafer may configured and/or used for any other specimen (e.g., a reticle, mask, or photomask).

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

In this invention, "axial" means "in the optical axis direction of an apparatus, column or a device such as a lens", while "radial" means "in a direction perpendicular to the optical axis". Usually, the optical axis starts from the cathode and ends at specimen. The optical axis always refers to z-axis in all drawings.

The term, crossover, refers to a point where the electron beam is focused.

The term, virtual source, means the electron beam emitted from the cathode can be traced back to a "virtual" source.

The inspection tool according to the present invention relates to a charged particle source, especially to an e-beam source which can be applied to a SEM, an e-beam inspection tool, or an EBDW. The e-beam source, in this art, may also be referred to as an e-gun (Electron Gun).

With respect to the drawings, it is noted that the figures are not drawn to scale. In particular, the scale of some of the elements of the figures may be greatly exaggerated to emphasize characteristics of the elements. It is also noted that the figures are not drawn to the same scale. Elements shown in more than one figure that may be similarly configured have been indicated using the same reference numerals.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

Figure 1B:
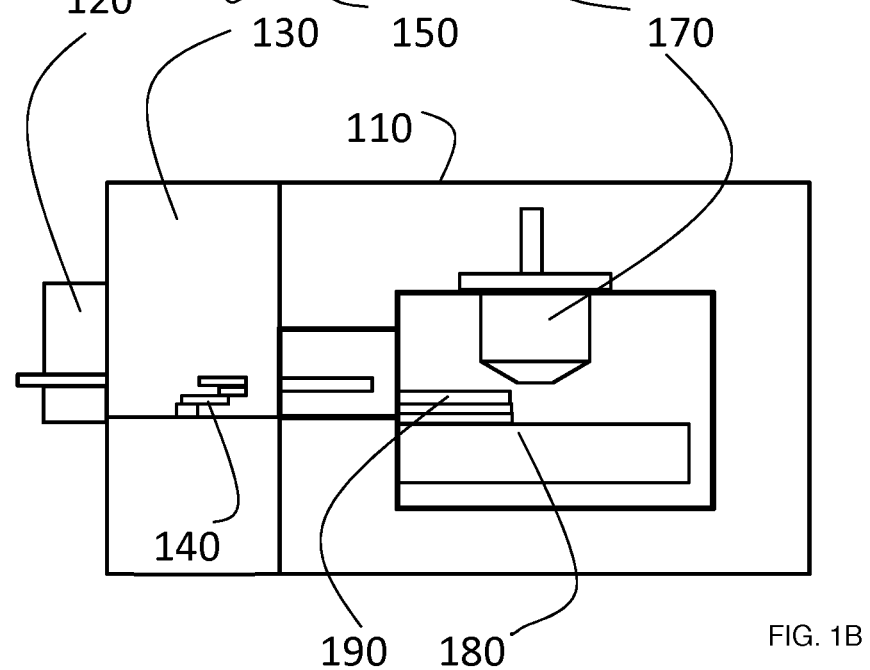

FIGS. 1A and 1B schematically depict a top view and a cross-sectional view of an electron beam (e-beam) inspection (EBI) system 100 according to an embodiment of the present invention. The embodiment as shown comprises an enclosure 110, a pair of load ports 120 serving as an interface to receive objects to be examined and to output objects that have been examined. The embodiment as shown further comprises an object transfer system, referred as an EFEM, equipment front end module 130, that is configured to handle and/or transport the objects to and from the load ports. In the embodiment as shown, the EFEM 130 comprises a handler robot 140 configured to transport objects between the load ports and a load lock 150 of the EBI system 100. The load lock 150 is an interface between atmospheric conditions occurring outside the enclosure 110 and in the EFEM and the vacuum conditions occurring in a vacuum chamber 160 of the EBI system 100. In the embodiment as shown, the vacuum chamber 160 comprises an electron optics system 170 configured to project an e-beam onto an object to be inspected, e.g. a semiconductor substrate or wafer. The EBI system 100 further comprises a positioning device 180 that is configured to displace the object 190 relative to the e-beam generated by the electron optics system 170.

In an embodiment, the positioning device may comprise a cascaded arrangement of multiple positioners such an XY-stage for positioning the object in a substantially horizontal plane, and a Z-stage for positioning the object in the vertical direction.

In an embodiment, the positioning device may comprise a combination of a coarse positioner, configured to provide a coarse positioning of the object over comparatively large distances and a fine positioner, configured to provide a fine positioning of the object over comparatively small distances. Thus, the fine positioner has a higher positioning accuracy and/or precision than the coarse positioner.

In an embodiment, the positioning device 180 further comprises an object table for holding the object during the inspection process performed by the EBI system 100. In such embodiment, the object 190 may be clamped onto the object table by means of a clamp such as an electrostatic clamp. Such a clamp may be integrated in the object table.

In accordance with the present invention, the positioning device 180 comprises a first positioner for positioning the object table and a second positioner for positioning the first positioner and the object table. In addition, the positioning device 180 as applied in the e-beam inspection tool 100 according to the present invention comprises a heating device that is configured to generate a heat load in the object table.

The positioning device 180 and heating device as applied in the present invention will be discussed in more detail below.

Figure 2:
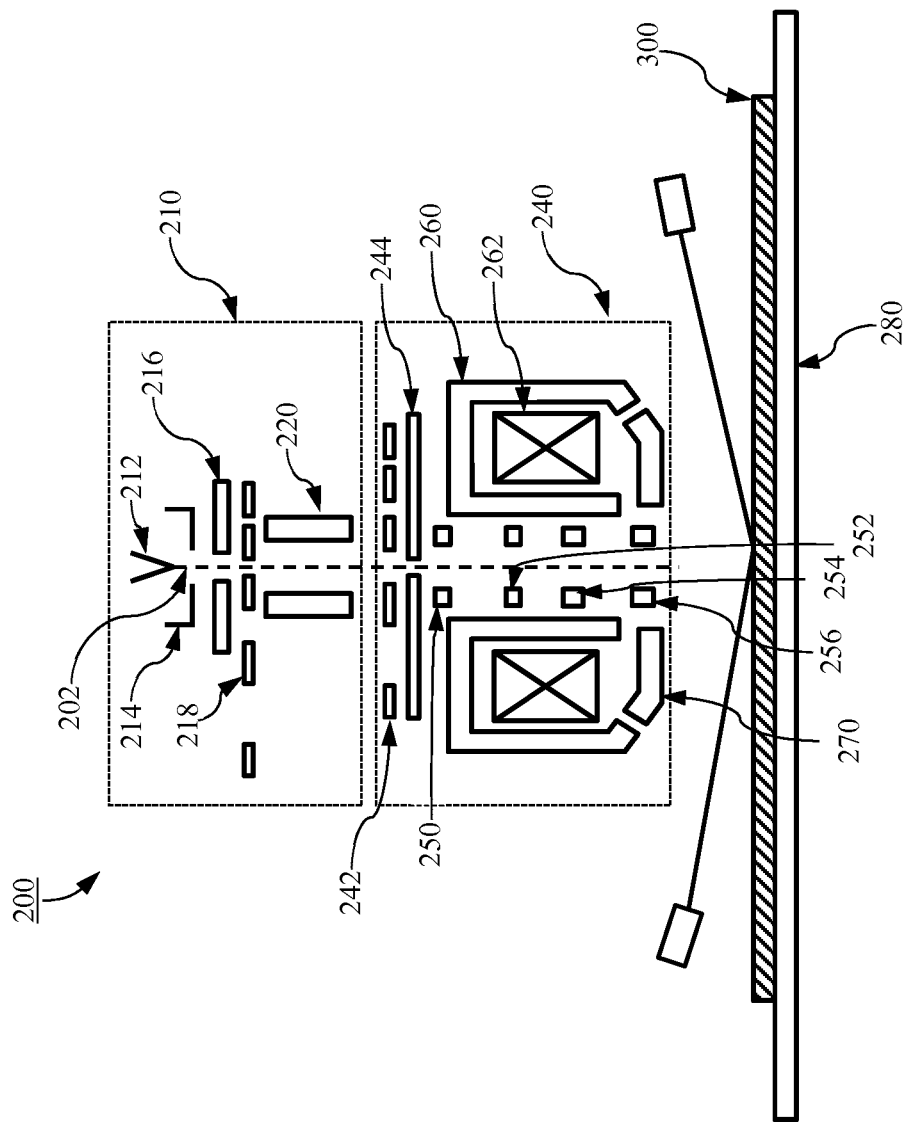
FIGS. 2 and 3 are schematic illustrations an electron optical system as can be applied in an embodiment of the present invention.

FIG. 2 schematically depict an embodiment of an electron optics system 200 as can be applied in e-beam inspection tool or system according to the present invention. The electron optics system 200 comprises an e-beam source, referred to as the electron gun 210 and an imaging system 240.

The electron gun 210 comprises an electron source 212, suppressor 214, an anode 216, a set of apertures 218, and a condenser 220. The electron source 212 can be a Schottky emitter. More specifically, the electron source 212 includes a ceramic substrate, two electrodes, a tungsten filament, and a tungsten pin. The two electrodes are fixed in parallel to the ceramic substrate, and the other sides of the two electrodes are respectively connected to two ends of the tungsten filament. The tungsten is slightly bended to form a tip for placing the tungsten pin. Next, a ZrO2 is coated on the surface of the tungsten pin, and is heated to 1300° C. so as to be melted and cover the tungsten pin but uncover the pinpoint of the tungsten pin. The melted ZrO2 can make the work function of the tungsten lowered and decrease the energy barrier of the emitted electron, and thus the electron beam 202 is emitted efficiently. Then, by applying negative electricity to the suppressor 214, the electron beam 202 is suppressed. Accordingly, the electron beam having the large spread angle is suppressed to the primary electron beam 202, and thus the brightness of the electron beam 202 is enhanced. By the positive charge of the anode 216, the electron beam 202 can be extracted, and then the Coulomb's compulsive force of the electron beam 202 may be controlled by using the tunable aperture 218 which has different aperture sizes for eliminating the unnecessary electron beam outside of the aperture. In order to condense the electron beam 202, the condenser 220 is applied to the electron beam 202, which also provides magnification. The condenser 220 shown in the FIG. 2 may e.g. be an electrostatic lens which can condense the electron beam 202. On the other hand, the condenser 220 can be also a magnetic lens.

Figure 3:
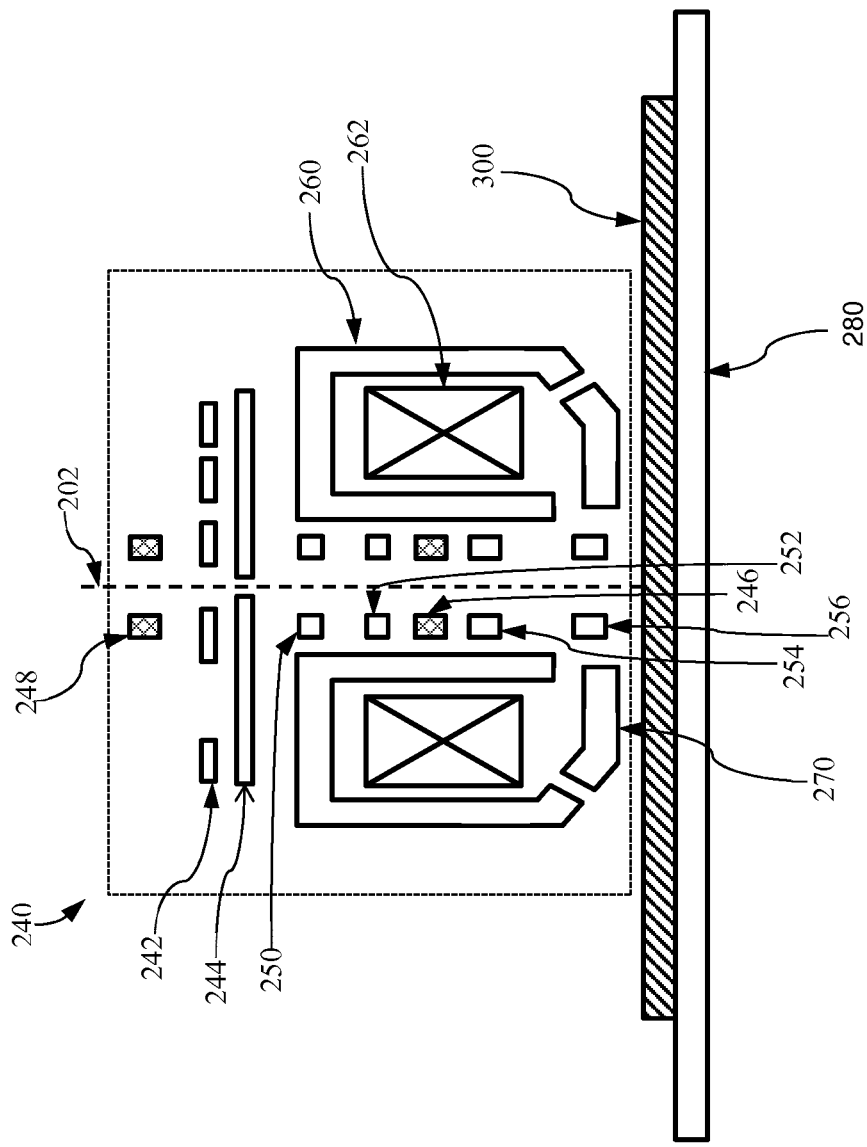

The imaging system 240 as shown in FIG. 3 comprises a blanker 248, a set of apertures 242, a detector 244, four sets of deflectors 250, 252, 254, and 256, a pair of coils 262, a yoke 260, a filter 246, and an electrode 270. The electrode 270 is used to retard and deflect the electron beam 202, and further has electrostatic lens function due to the combination of upper pole piece and sample 300. Besides, the coil 262 and the yoke 260 are configured to the magnetic objective lens.

The electron beam 202, described above, is generated by heating the electron pin and applying the electric field to anode 216, so that, in order to stabilize the electron beam 202, there must be a long time for heating the electron pin. For a user end, it is surely time consuming and inconvenient. Hence, the blanker 248 is applied to the condensed electron beam 202 for temporally deflecting the electron beam 202 away from the sample rather than turning off it.

The deflectors 250 and 256 are applied to scan the electron beam 202 to a large field of view, and the deflectors 252 and 254 are used for scanning the electron beam 202 to a small field of view. All the deflectors 250, 252, 254, and 256 can control the scanning direction of the electron beam 202. The deflectors 250, 252, 254, and 256 can be electrostatic deflectors or magnetic deflectors. The opening of the yoke 260 is faced to the sample 300, which immerses the magnetic field into the sample 300. On the other hand, the electrode 270 is placed beneath the opening of the yoke 260, and therefore the sample 300 will not be damaged. In order to correct the chromatic aberration of the electron beam 202, the retarder 270, the sample 300, and the upper pole piece form a lens to eliminate the chromatic aberration of the electron beam 202.

Besides, when the electron beam 202 bombards into the sample 300, a secondary electron will be emanated from the surface of the sample 300. Next the secondary electron is directed to the detector 244 by the filter 246.

Figure 4:
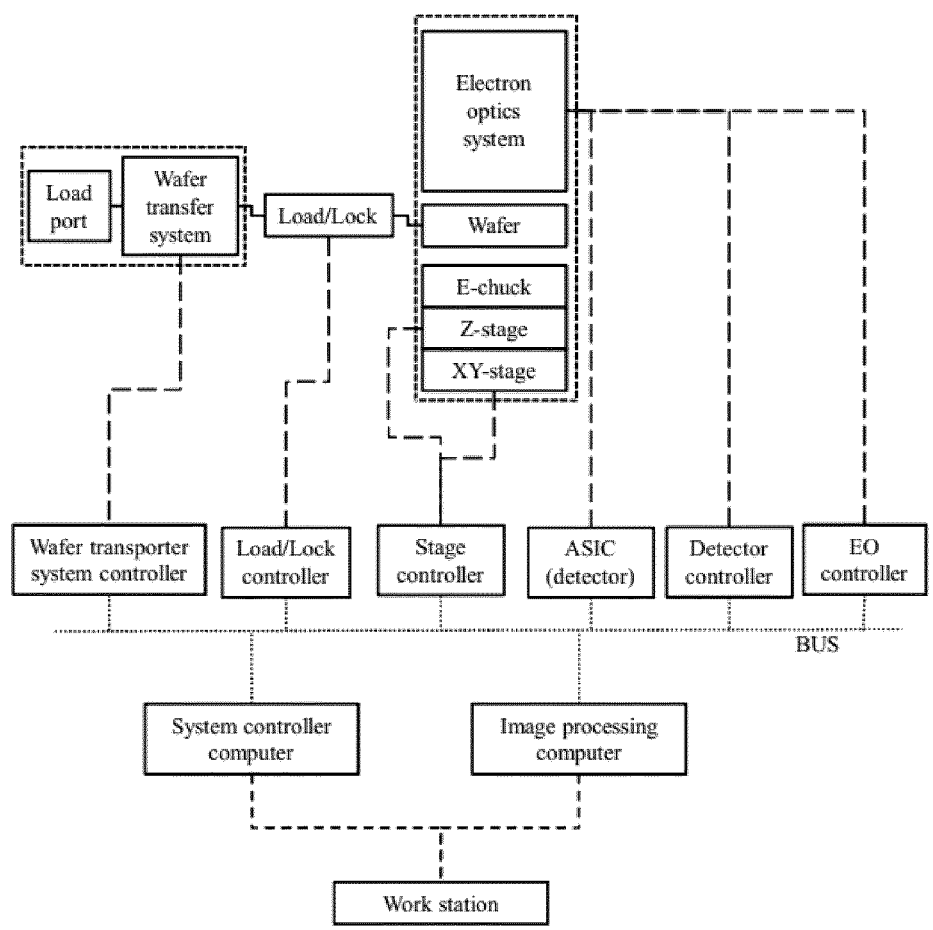
FIG. 4 schematically depicts a possible control architecture of an EBI system according to the present invention.

FIG. 4 schematically depicts a possible control architecture of an EBI system according to the present invention. As indicated in FIG. 1, the EBI system comprises a load lock, a wafer transfer system, a load/lock, an electron optics system and a positioning device, e.g. including a z-stage and an x-y stage. As illustrated, these various components of the EBI system may be equipped with respective controllers, i.e., a wafer transporter system controller connected to the wafer transfer system, a load/lock controller, an electron optics controller, a detector controller, a stage controller. These controllers may e.g. be communicatively connected to a system controller computer and an image processing computer, e.g. via a communication bus. In the embodiment as shown, the system controller computer and the image processing computer may be connected to a workstation.

The load port loads a wafer to the wafer transfer system, such as EREM 130, and the wafer transfer system controller controls the wafer transfer to transfer the wafer to the load/lock, such as load lock 150. The load/lock controller controls the load/lock to the chamber, such that an object that is to be examiner, e.g. a wafer can be fixed on a clamp, e.g. an electrostatic clamp, also referred to as an e-chuck. The positioning device, e.g. the z-stage and the x-y stage, enable the wafer to move by the stage controller. In an embodiment, a height of the z-stage may e.g. be adjusted using a piezo component such as a piezo actuator. The electron optic controller may control all the conditions of the electron optics system, and the detector controller may receive and convert the electric signals from the electron optic system to image signals. The system controller computer is to send the commands to the corresponding controller. After receiving the image signals, the image processing computer may process the image signals to identify defects.

Figure 5A:
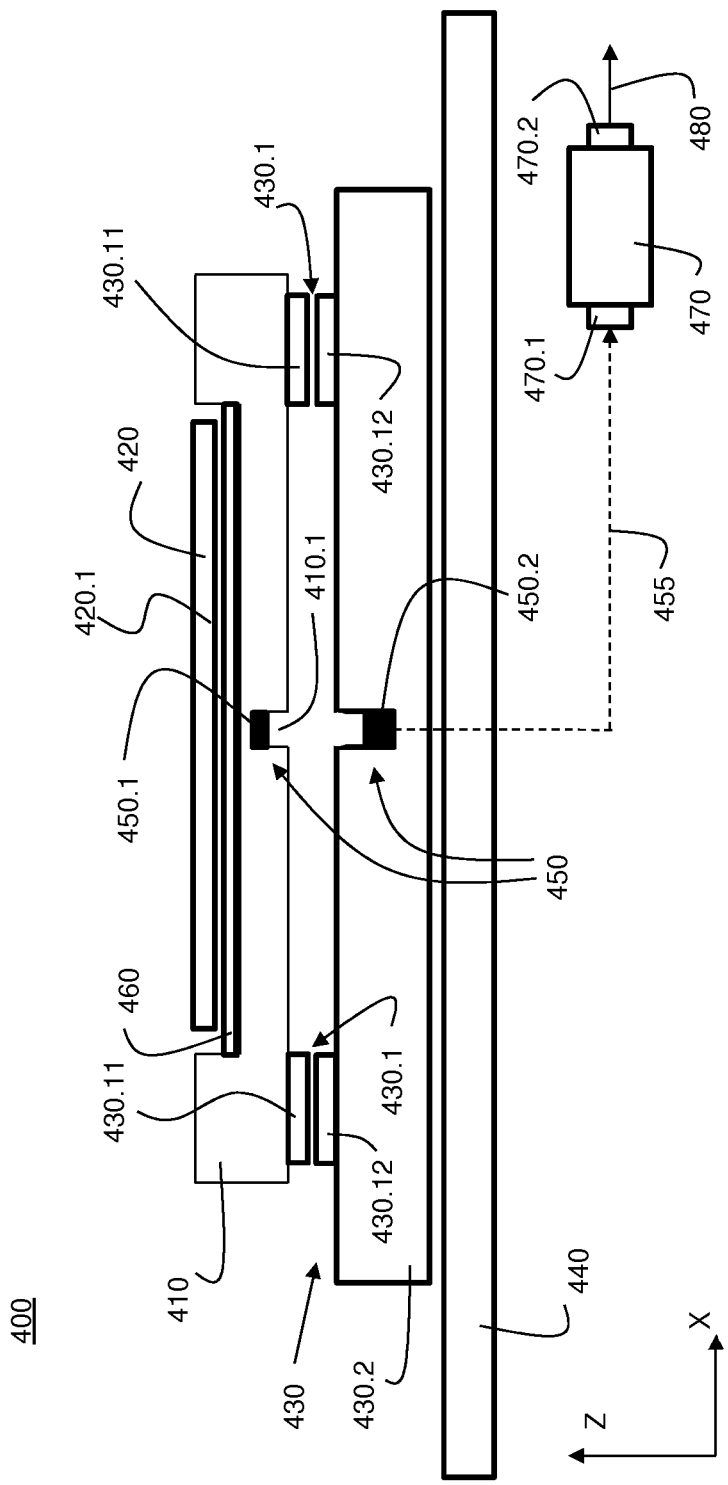
FIG. 5a schematically depicts a first stage apparatus according to the invention.

FIG. 5a schematically depicts an embodiment of a stage apparatus 400 which can e.g. be applied in an inspection tool such as an electron beam inspection (EBI) tool according to the present invention or in a lithographic apparatus. The stage apparatus according to the present invention may also be applied in other electron beam tools, such as a CD-SEM, an e-beam mask writer, an e-beam lithographic apparatus, etc. and metrology tools such as CD, overlay, or focus metrology tools.

In accordance with the present invention, a stage apparatus, such as stage apparatus 400, is an apparatus that comprises an object table 410 that is configured to hold an object 420. Such an object 420 may e.g. be a semiconductor substrate that needs to be processed. In case of an application in a lithographic apparatus, such processing may e.g. involve a measurement process, whereby the object 420 is subjected to various measurements such as the determination of a height map of the object or the determination of a position of one or more marks, e.g. alignment marks, on the object. Such processing may also involve an exposure process, whereby the object 420 is subjected to a patterned beam of radiation, in order to pattern one or more target portions of the object.

In case of an application in an inspection tool or apparatus, the object may be subject to an inspection process for determining one or more parameters or characteristics of structures or patterns on the object. Examples of such parameters may include, but are not limited to, critical dimensions (CD), line width roughness (LWR), line edge roughness (LER), side wall angle (SWA), overlay (OV), etc.

The stage apparatus 400 according to the present invention further comprises a positioning device 430 for positioning the object table 410. Such a positioning device 430 may e.g. comprises one or more actuators 430.1 or motors for displacing and positioning the object table 410. By means of the positioning device 430, the object table 410 can be positioned with respect to a measurement beam or patterned radiation beam, in case the stage apparatus is applied in an inspection tool or a lithographic apparatus.

Figure 5B:
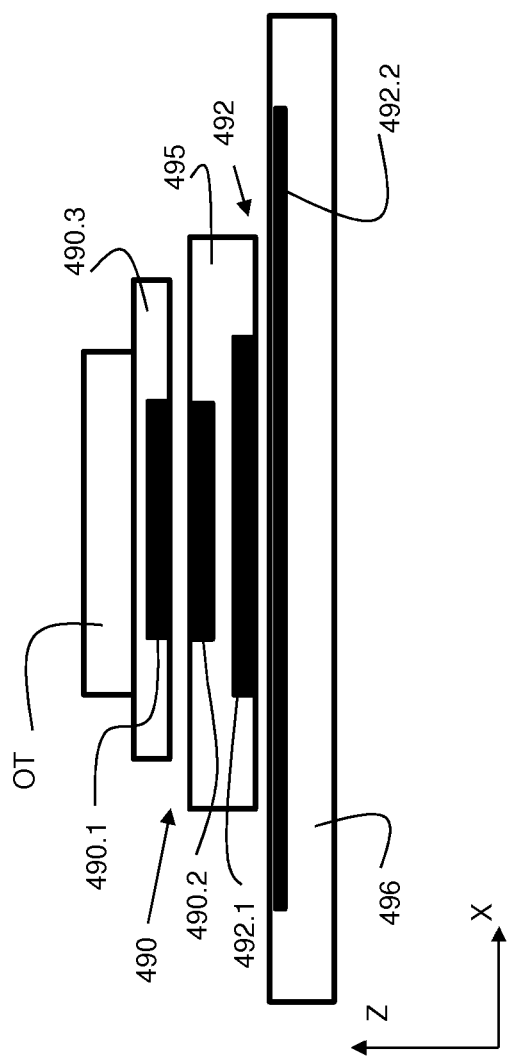
FIG. 5b schematically depicts a stage apparatus having a two-stage positioning device.

In the embodiment as shown, the actuators 430.1 may e.g. be electromagnetic actuators 430.1, the electromagnetic actuators 430.1 comprising a first member 430.11, e.g. comprising one or more permanent magnets, that is mounted to the object table 410 and a second member 430.12, e.g. comprising one or more electrical coils, that is mounted to a positioning member 430.2 of the positioning device 430. In the embodiment as shown, the positioning member 430.2 is supported by a support frame 440 of the stage apparatus 400. In an embodiment, the positioning member 430.2 may comprises one or more linear motors and/or planar motors for positioning the one or more actuators 430.1 and the object table 410 relative to the support frame 440. In such an embodiment, the positioning device 430 thus comprises a first positioning device, e.g. actuators 430.1, that is configured to position the object table 410 and a second positioning device, e.g. positioning member 430.2, that is configured to position the first positioning device, together with the object table 410. This positioning principle is explained in more detail in FIG. 5b. FIG. 5b schematically shows a two-stage or cascaded positioning device, as can be applied in the present invention. FIG. 5b schematically shows an object table OT that is configured to be positioned using a two-stage or cascaded positioning device. In such a two-stage or cascaded positioning device, a first positioning device 490 is provided to displace the object table OT relative to a carrier 495. The positioning device 490 comprises a first member 490.1 that is mounted to a holder 490.3, the holder 490.2 being mounted to the object table OT, and a second member 490.2 that is mounted to the carrier 495. The first member 490.1 and the second member 490.2 are configured to interact with each other, e.g. by means of an electromagnetic interaction, thereby realising a relative displacement of the first member 490.1 and the second member 490.2 and thus of the object table OT relative to the carrier 495. The positioning device 490 may e.g. be similar to the one or more electromagnetic actuators 430.1 shown in FIG. 5a. The two-stage positioning device as shown in FIG. 5b further comprises a second positioning device 492 that is configured to displace the carrier 495. The second positioning device 492 comprises a first member 492.1 that is mounted to the carrier 495, and a second member 492.2 that is mounted to a support frame 496. In the embodiment as shown, the first member 492.1 and the second member 492.2 of the second positioning device 492 are configured to interact with each other, e.g. by means of an electromagnetic interaction, thereby realising a relative displacement of the first member 492.1 and the second member 492.2 and thus of the carrier 495 relative to the support frame 496. In such a two-stage or cascaded positioning device, the first positioning device 490 may e.g. be configured to position the object table over a comparatively small range, relative to the second positioning device 492, whereas the second positioning device 492 may e.g. be configured to position the first positioning device 490 and the object table OT, over a comparatively large range. Typically, the comparatively small range may e.g. be ~1 to 5 mm, whereas the comparatively large range may e.g. be ~300 mm or larger.

In an embodiment of the present invention, the positioning device of the stage apparatus thus comprises a first positioning device having a shorter range of motion than a second positioning device of the positioning device. typically, the application of a shorter required range of motion also enables a more accurate positioning. As such, first positioning device, having a shorter range of motion, may also be referred to as a fine positioning device, whereas the second positioning device, having a longer range of motion, may also be referred to as a coarse positioning stage.

When performing a measurement process or an exposure process, it is desirable to have information regarding a temperature of the object that is processed. In order to accommodate this, the stage apparatus according to the present invention, e.g. stage apparatus 400, further comprises a remote temperature sensor 450 configured to measure a temperature of the object table 410 and/or the object 420. In the embodiment shown in FIG. 5a, the remote temperature sensor 450 is configured to measure a temperature of the object table 410. In the embodiment as shown, the temperature sensor 450 comprises a first part 450.1 that is mounted to the object table 410 and a second part 450.2 that is mounted to the positioning device 430, in particular to the positioning member 430.2. In an embodiment, the first part 450.1 of the temperature sensor 450 may comprises a passive temperature sensing element 450.1. In the embodiment as shown, the passive temperature sensing element 450.1 is mounted in a protrusion or aperture 410.1 of the object table 410. In an embodiment of the present invention, the passive temperature sensing element may also be mounted to a clamp, e.g. an electrostatic clamp, of the object table, as will be discussed below.

Within the meaning of the present invention, the mounting of the first part of the remote temperature sensor to the object table may be realised in various manners; the first part may be mounted or connected to a surface of the object table or it may be inserted in an aperture of the object table. The mounting of the first part to the object table may also involve embedding the first part in the object table.

Within the meaning of the present invention, a remote temperature sensor refers to a temperature sensor which is at least partly arranged at a distance from the location where the temperature is measured. In an embodiment, the remote temperature sensor may e.g. comprises an irradiation source configured to generate a measurement beam and a detector configured to receive a reflected measurement beam, e.g. reflected off a passive temperature sensing element. In such an embodiment, the irradiation source and/or the detector may be arranged remote, i.e. at a distance, from the passive temperature sensing element. In a preferred embodiment, the remote temperature sensor does not require a mechanical, e.g. wired or solid, connection between the sensing element and the detector of the temperature sensor. In such embodiment, the measurement signal, from which the temperature may be derived, should at least partially propagate from the sensing element to the detector via a non-solid connection, e.g. through a gaseous or vacuum environment.

As an example, the remote temperature sensor as applied in the present invention may be configured to determine a temperature of the object table based on an optical characteristic of the passive temperature sensing element. Such embodiment may e.g., as indicated above, comprise an irradiation source for irradiating the passive temperature sensing element with a measurement beam, and a detector configured to receive a reflected measurement beam from the passive temperature sensing element. As such, in the embodiment as shown, the second part 450.2 of the remote temperature sensor 450 may comprise an irradiation source for irradiating the temperature sensing element 450.1 and a detector configured to receive a reflected measurement beam from the passive temperature sensing element 450.1. In the embodiment as shown, the optical path between the irradiation source and the sensing element and the optical path between the sensing element and the detector are, at least partly, without a mechanical connection. In such an embodiment, disturbances such as vibrations of the positioning device may be hindered to propagate to the object table holding the object.

In accordance with an embodiment of the present invention, the remote temperature sensor makes use of a passive temperature sensing element. Within the meaning of the present invention, a passive temperature sensing element refers to a temperature sensing element that does not need to be powered. In an embodiment, the passive temperature sensing element may e.g. be mounted to the object table. In such embodiment, because of the passive nature of the temperature sensing element, no power supply wiring needs to be arranged towards the object table. As will be appreciated by the skilled person, such a wiring would, in a similar manner as discussed above, give rise to a transmission of disturbances such as vibrations towards the object table.

In addition, the use of a passive temperature sensing element facilitates the application of an electric voltage to the object or the object table. As will be appreciated by the skilled person, electric voltages, e.g. comparatively high voltages, may be applied in stage apparatuses for various reasons.

As a first example, the use of electrostatic clamping of objects can be mentioned. In case an object such as a semiconductor substrate needs to be clamped onto an object table, various options exist, depending on the atmospheric conditions in which the object is processed. In case of vacuum or low pressure applications, an electrostatic clamping of the object may be preferred. In such an embodiment, the object table may thus comprise an electrostatic clamp, e.g. a clamp comprising an electrode to which, during use, a voltage is applied. As a result, the object table, or parts thereof, will be, during operation, at a different voltage level than other parts of the apparatus, e.g. the positioning device. In the embodiment as shown, the object table 410 comprises an electrostatic clamp 460 that is mounted to a surface of the object table that is configured to receive the object 420. Such an electrostatic clamp may e.g. comprise one or more electrodes that are covered with an insulating layer. Such an electrostatic clamp may e.g. comprise one or more electrodes that are covered with an insulating layer. In an embodiment of the present invention, the electrostatic clamp may e.g. be a structure having a thickness of approx. 1 cm, which can e.g. be made from a ceramic material. The electrostatic claim 460 may e.g. be connected to a surface of the object table 410.

As a second example, the use of an electrode in or on the object table or the application of a voltage to the object can be mentioned. In case the stage apparatus according to the present invention is applied in an inspection tool or apparatus, in particular an inspection tool that applies a charged particle beam or an electron beam, it may be advantageous to apply a voltage to the object or provide an electrode that is arranged in or on the object table with a voltage during use. As an example, in case of an electron beam inspection tool, it may be advantageous to apply a comparatively high negative voltage to the object, in order decelerate the electrons of the electron beam. By appropriately charging the object or the electrode, the velocity of the electrons of the electron beam can be controlled. It can be mentioned, that the applied voltage in such cases may be comparatively high.

As such, due to the applied voltage, an electrical field gradient may exist across the object table 410. As a consequence of the application of the electrostatic clamp or the charging of the object or electrode, an appropriate electrical insulation would need to be applied to any device, such as a sensor or sensor part, that is mounted to the object table and that has a wired connection to other parts of the apparatus. Such an electrical insulation may however be a source of contamination, e.g. due to outgassing of the insulating material applied. It can further be mentioned that the application of electrical conductors, e.g. conductors required to connect a sensor or sensor part that is mounted to the object table, may cause an electric discharge when applied in the electrical field generated by the applied voltage.

By applying, as done in an embodiment of the present invention, a passive temperature sensing element 450.1, the use of electrical insulation may be reduced or avoided, since no wiring, e.g. electrical wiring, towards the sensing element is required.

In an embodiment of the present invention, the remote temperature sensor is configured to irradiate a passive temperature sensing element, e.g. a passive temperature sensing element 450.1 that is mounted to the object table 410, with an irradiation beam, also referred to as a measurement beam and receive a reflected irradiation beam, also referred to as a reflected measurement beam. Such a reflected measurement beam may e.g. be received by one or more detectors of the remote temperature sensor, e.g. temperature sensor 450.

In an embodiment of the present invention, the passive temperature sensing element has a temperature dependent characteristic. As an example, the passive temperature sensing element may e.g. have a temperature dependent reflectivity or absorption coefficient. Such a temperature dependent reflectivity or absorption coefficient may also be frequency dependent. In an embodiment, the passive temperature sensing element comprises Gallium arsenide (GaAs), e.g. a Gallium arsenide crystal. GaAs is a known semiconductor having a band gap which is temperature dependent. As such, when a GaAs element is irradiated with a measurement light, the measurement light will partly be reflected, whereby a spectrum of the reflected measurement light may vary, depending on the temperature or the GaAs element. In particular, in case different wavelengths or wavelength ranges of the reflected measurement light are observed, e.g. in a detector of the remote temperature sensor, the intensities of the reflected measurement beam at the different wavelengths or wavelength ranges will vary, depending on the temperature. In particular, when the temperature of the GaAs element increases, the transmission spectrum shifts to higher wavelengths. As such, the temperature of the GaAs may be determined from the spectrum of the reflected measurement light. As such, in an embodiment of the present invention, a detector is applied that is configured to determine a characteristic of the spectrum of the reflected measurement light as received from the passive temperature sensing element, e.g. a GaAs crystal. In such embodiment, the detector may be configured to generate a detector signal, indicated by the dotted line 455, representative of the received reflected measurement light and provide this detector signal 455 to a processing unit 470 configured to process the signal. In an embodiment, the detector may be configured to provide a first detector signal, representative of the reflected measurement beam at a first frequency or frequency range, and a second detector signal, representative of the reflected measurement beam at a second frequency or frequency range, to the processing unit 470. In FIG. 5a, a processing unit 470 is schematically shown, the processing unit 470 having an input terminal 470.1 and an output terminal 470.2. Such a processing unit may be integrated in a control unit of the stage apparatus, or may be a dedicated processing unit for processing the detector signal 455. Such a processing unit 470 may e.g. comprise a processor, microprocessor, computer or the like. Such a processing unit may then e.g. analyse the spectrum of the received detector signal, e.g. received via input terminal 470.1 of the processing unit 470, and determine, based on such analysis, the temperature of the GaAs crystal and thus the object table or object to which the crystal is mounted. Such an analysis may e.g. be based on an assessment of the detector signal or signals representing the reflected measurement beam at different frequencies or different frequency ranges. The processing unit may e.g. be configured to determine a ratio of an intensity of the reflected measurement beam at a first frequency or frequency range to an intensity of the reflected measurement beam at a second frequency or frequency range and determine a temperature of the passive temperature sensing element based on this ratio.

In such case, the processing unit 470 may be configured to output, e.g. via the output terminal 470.2, a temperature signal 480 representative of the determined temperature. As an example of a detector as can be applied in the remote temperature sensor as applied in the stage apparatus according to the present invention, a spectrometer may be mentioned.

In the embodiment as schematically shown in FIG. 5a, a passive temperature sensing element 450.1, e.g. a GaAs crystal, is mounted to the object table 410. Alternatively, such a passive temperature sensing element may be mounted to the clamp 460 as well. The passive temperature sensing element may be mounted to the object 420 as well, e.g. to a bottom surface 420.1 of the object 420. In such an arrangement, the temperature of interest, i.e. the temperature of the object 420, may be determined in a more direct manner.

In an embodiment of the present invention, the processing unit 470 as applied to process the detector signal 455 may further comprises a thermal model of the object table 410 and may be configured to determine a temperature of the object based on the detector signal 455 and the thermal model. Such a thermal model may e.g. provide in a correlation or correspondence between a temperature of the object table as measured and a temperature of the object. Such a thermal model may e.g. be determined empirically or by means of simulations. Alternatively, or in addition, a thermal model may be applied to determine or estimate a temperature at a point of interest within the object table, e.g. close to an upper surface of the object table, e.g. close to the applied clamp. In such embodiment, the thermal model may thus be used to determine a temperature of the object table, rather than a temperature of the object. In an embodiment, the thermal model as applied may be a model of the object table and/or the object. A model of the object may be advantageously applied in case a temperature gradient is expected in the object.

Figure 6:
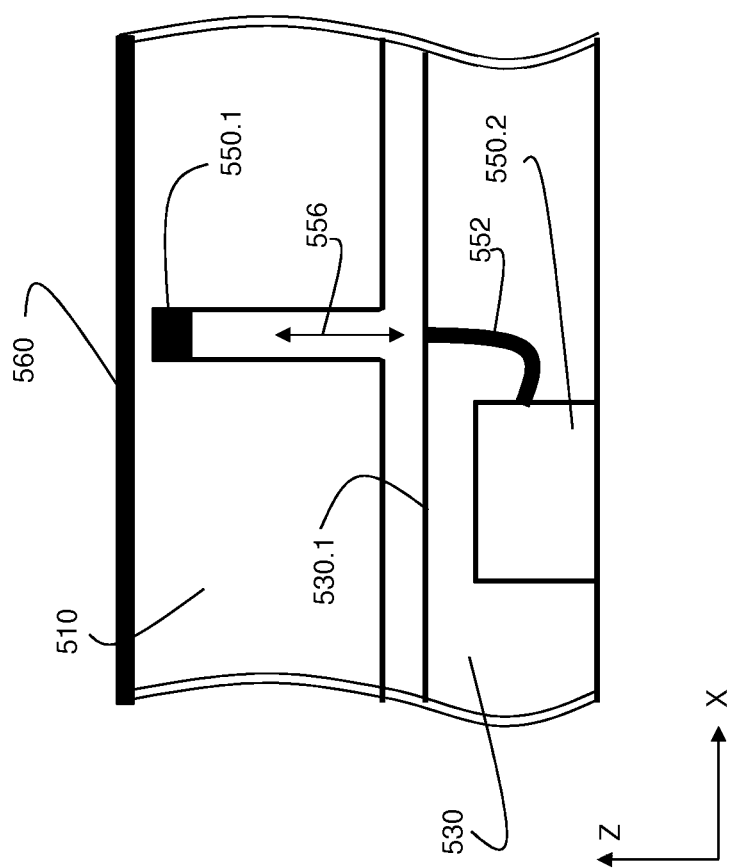
FIGS. 6-9 schematically depict parts of stage apparatuses according to the invention.

FIG. 6 schematically shown a more detailed view of part of a stage apparatus according to the present invention. FIG. 6 schematically shows part of an object table 510, the object table 510 being provided with a clamp 560, e.g. an electrostatic clamp for holding an object (not shown). FIG. 6 further shows part of a positioning device 530 that is configured to position the object table 510. In the embodiment as shown, a remote temperature sensor 550 is applied to determine a temperature of the object table, the remote temperature sensor 550 comprising a passive temperature sensing element 550.1 and a source/detector module 550.2, the source/detector module 550.2 e.g. comprising an irradiation source such as an LED and a detector, whereby the irradiation source is configured to emit a measurement light or beam of light towards the passive temperature sensing element 550.1 and whereby the detector is configured to receive a reflected measurement light or beam of light from the passive temperature sensing element 550.1. In the embodiment as shown, the measurement light and the reflected measurement light are guided by an optical fiber 552 from the source/detector module towards the surface 530.1 of the positioning device 530 and back. Arrow 556 indicates the measurement beam towards the passive temperature sensing element and the reflected measurement beam towards the optical fiber 552. In the embodiment as shown, the optical path of the measurement beam and the reflected measurement beam between the surface 530.1 and the passive temperature sensing element 550.1 does not require a mechanical, e.g. wired connection. By doing so, a transmission of disturbances of the positioning device 530 towards the object table 510 can be mitigated or avoided.

In the embodiment as shown, the positioning device 530 may be configured to displace the object table 510, e.g. in the indicated X-direction and an Y-direction perpendicular to the X-plane.

For the arrangement as depicted, it may occur that, in case the object table 510 is displaced in the X-direction, that the emitted measurement beam 556 no longer reaches the passive temperature sensing element 550.1 because the element is outside the line-of sight of the measurement beam 556.

Figure 7:
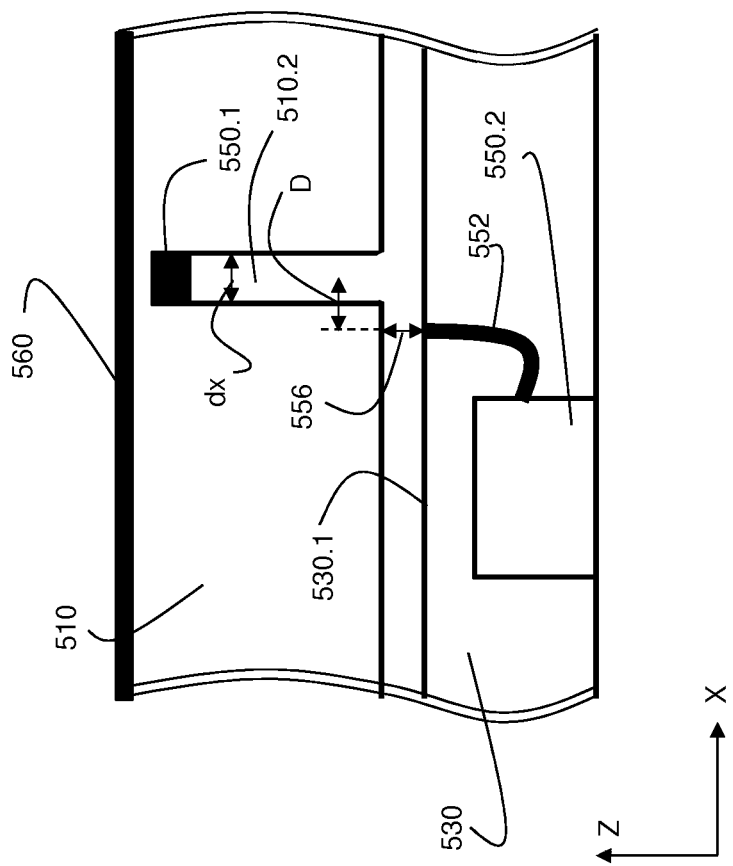

This is schematically shown in FIG. 7. FIG. 7 schematically shows the same features as shown in FIG. 6. Compared to FIG. 6, the object table 510 is displaced over a distance D relative to the positioning device 530, in the indicated X-direction. As a result, the measurement beam 556 can no longer reach the passive temperature sensing element 550.1. For the shown embodiment, the available range of motion of the object table 510 relative to the positioning device, in particular the optical fiber 552 emitting the measurement beam and receiving the reflected measurement beam, in the X-direction, is determined by the size of the passive temperature sensing element 550.1 in the X-direction, dx. In the embodiment as shown, the size of the passive temperature sensing element 550.1 substantially correspond to the size of an aperture 510.2 of the object table 510 that is used to insert the passive temperature sensing element 550.1. The available range of motion which allows the capturing of a reflected measurement beam by the remote temperature sensor is, within the present invention, referred to as the capturing range of the temperature sensor.

In an embodiment of the present invention, care is taken that the capturing range of the remote temperature sensor as applied is equal or larger than an operating range, or stroke, of the positioning device, e.g. positioning device 530 of FIGS. 6 and 7 or positioning device 430 as shown in FIG. 5.

In order to ensure that a capturing range of the remote temperature sensor is equal or larger than an operating range of the positioning device, various measures can be taken.

As a first example, the application of a larger passive temperature sensing element 550.1 or the application of an array of such elements, thereby increasing the distance dx as shown in FIG. 7, and thus the capturing range of the sensor. In an embodiment, the passive temperature sensing element may thus comprise a plurality of discrete elements, arranged next to each other, e.g. in a one-dimensional or two-dimensional array.

As a second example, use can be made of one or more lenses or lens-shaped surfaces that facilitate the emission of the measurement beam towards the passive temperature sensing element and the receipt of the reflected measurement beam from the passive temperature sensing element.

Figure 8A:
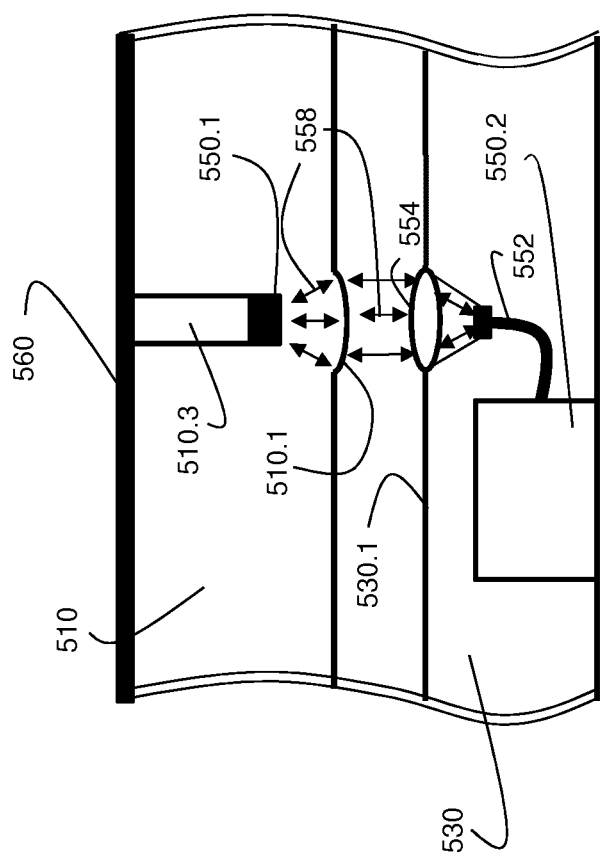
Figure 8B:
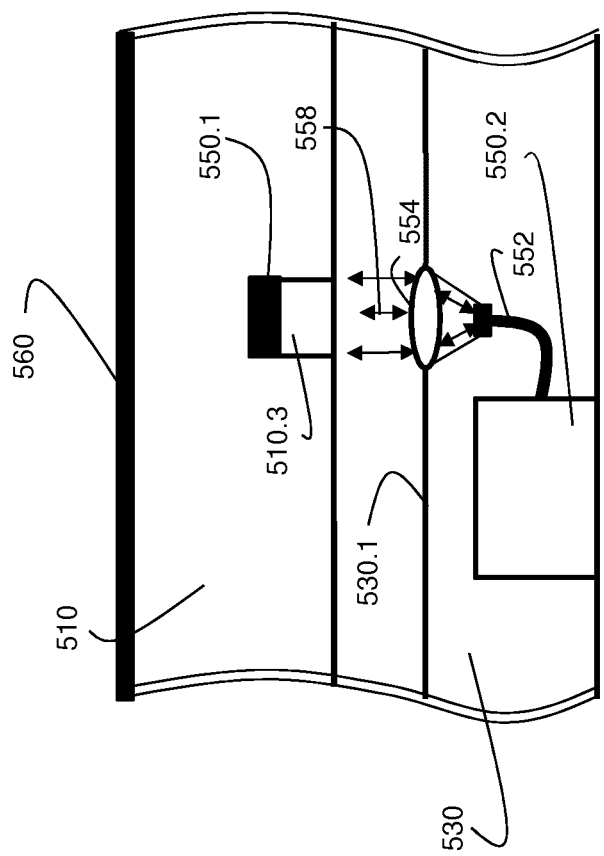
Figure 8C:
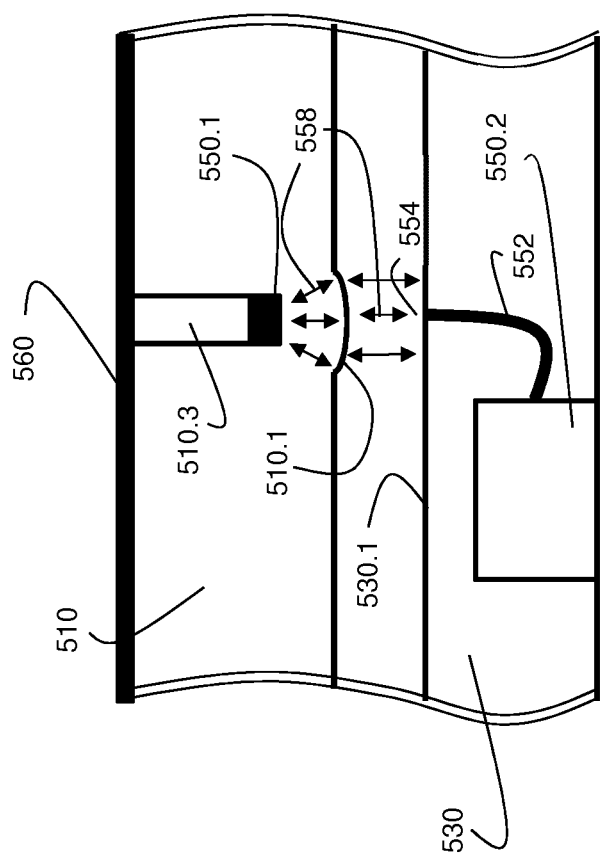

FIG. 8a schematically illustrates an embodiment of the present invention, which is similar to the embodiment of FIG. 6, apart from the following: in the embodiment as shown, the object table 510 is provided with a lens shaped surface 510.1 that is configured to receive a measurement beam from the irradiation source and emit a reflected measurement beam towards the detector of the remote temperature sensor. In the embodiment as shown, a lens 554 is provided that is configured to receive the reflected measurement beam from the passive temperature sensing element 550.1, and to emit the measurement beam towards the passive temperature sensing element 550.1 of the remote temperature sensor. In the embodiment as shown, the arrows 558 illustrate the optical paths along which the measurement beam and the reflected measurement beam may propagate. The application of the lens shaped element and/or the lens element may enable a more effective emission of the measurement beam and a more effective receipt of the reflected measurement beam. In addition, the use of the lens shaped element and/or the lens element may enable to enlarge the capturing range of the remote temperature sensor. With respect to the embodiment shown in FIG. 8a, it can be pointed out that the passive temperature sensing element 550.1 may be brought in the position as indicated by creating a protrusion or aperture 510.3 in the object table 510 and inserting the passive temperature sensing element 550.1 therein. It can be pointed out that the lens 554 and the lens shaped surface 510.1 may also be applied separately. FIGS. 8b and 8c respectively show two further embodiments of the present invention whereby either the lens 554 or the lens shaped surface 510.1 are applied. In FIG. 8b, the measurement beam and reflected measurement beam, both indicated by reference number 558, pass through the lens 554 that is configured to appropriately shape the beams. In the embodiment as shown, the passive temperature sensing element 550.1 is mounted to the object table 510 via an aperture 510.3, e.g. in a similar manner as discussed in FIG. 5a, 6 or 7. In FIG. 8c, the measurement beam and reflected measurement beam, both indicated by reference number 558, pass through a lens shaped surface 510.1 of the object table. By doing so, an increased capturing range of the beams may be realised as well.

Figure 9:
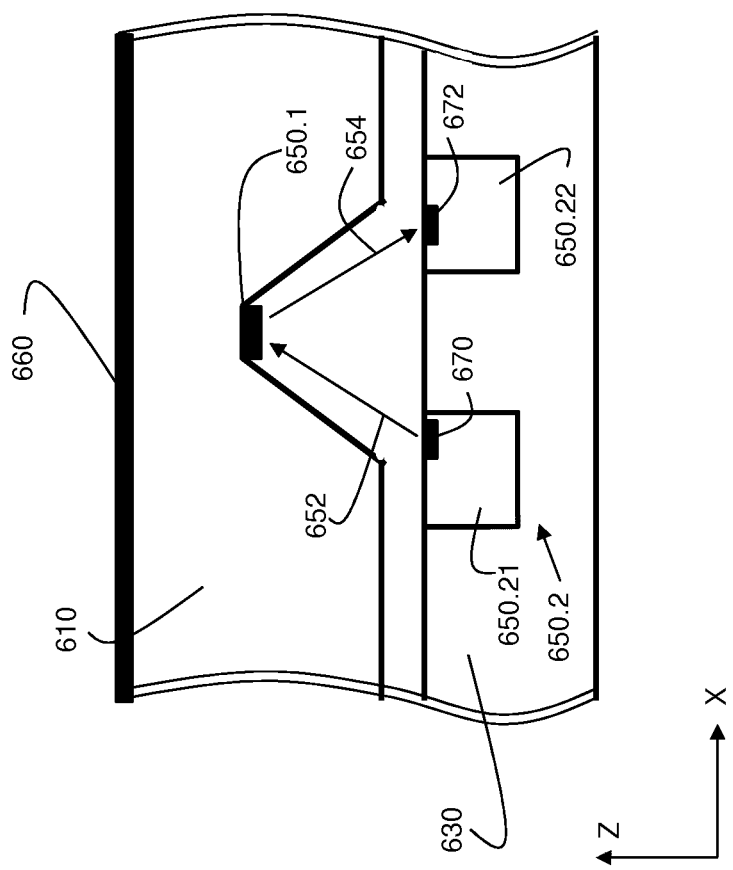

In the embodiments shown in FIGS. 5-8c, the optical path of the measurement beam and the optical path of the reflected measurement beam substantially coincided. It can be pointed out that embodiment may be considered whereby the optical path of the measurement beam and the optical path of the reflected measurement beam do not coincide. Such an embodiment is schematically shown in FIG. 9. FIG. 9 schematically shown a more detailed view of part of a stage apparatus according to the present invention including part of an object table 610, the object table 610 being provided with a clamp 660, e.g. an electrostatic clamp for holding an object (not shown). FIG. 9 further shows part of a positioning device 630 that is configured to position the object table 610. In the embodiment as shown, a remote temperature sensor 650 is applied to determine a temperature of the object table, the remote temperature sensor 650 comprising a passive temperature sensing element 650.1 and a source/detector module 650.2, the source/detector module 650.2 e.g. comprising an irradiation source 650.21, e.g. including an LED 670 and a detector 650.22, e.g. including a photodiode, CCD array or the like 672, whereby the irradiation source 650.21 is configured to emit a measurement light or beam of light, indicated by the arrow 652 towards the passive temperature sensing element 650.1 and whereby the detector 650.22 is configured to receive a reflected measurement light or beam of light, indicated by the arrow 654, from the passive temperature sensing element 650.1.

In the embodiments as shown in FIGS. 5 to 9, the remote temperature sensor, in particular the irradiation source and the detector of the remote temperature sensor are mounted to a positioning device of the stage apparatus. Alternatively, the remote temperature sensor or part thereof may be mounted to a frame of the apparatus, e.g. a substantially stationary frame of the apparatus such as a support frame or a metrology frame. Such a support frame may e.g. be configured to support the positioning device and object table of the stage apparatus and may also serve as a base frame of the apparatus.

The remote temperature sensor or part thereof may also be mounted to a metrology frame of the stage apparatus. In an embodiment, the stage apparatus according to the present invention comprises a position measurement system for measuring a position of the object table. Such a position measurement system may e.g. be an encoder based measurement system or an interferometer based measurement system. Such a measurement system typically comprises a position sensor and a position target, whereby the position sensor is configured to determine a position of the position target, relative to the position sensor, e.g. based on a received reflected measurement beam, reflected off the position target. In case of an encoder based position measurement system, the position target may e.g. comprises a one-dimensional or two-dimensional grating. In case of an interferometer based position measurement system the position target may e.g. comprises a reflective surface, e.g. a mirror.

Figure 10:
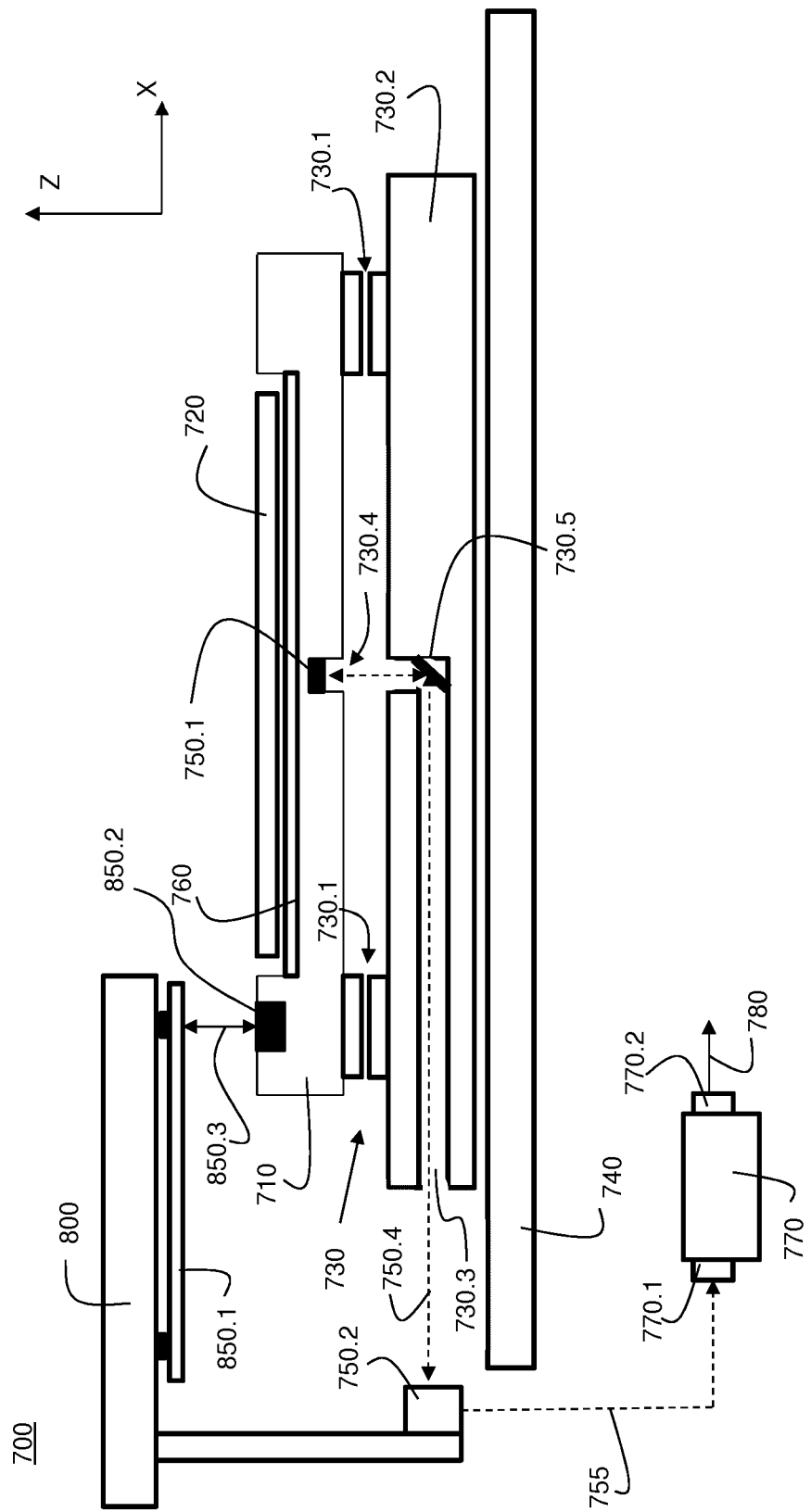
FIG. 10 schematically depicts a second stage apparatus according to the invention.

FIG. 10 schematically shows an embodiment of a stage apparatus 700 according to the present invention. Similar to the embodiment shown in FIG. 6, the stage apparatus 700 comprises an object table 710 that is configured to hold an object 720. In the embodiment as shown, the object table 710 comprises an electrostatic clamp 760 that is mounted to a surface of the object table that is configured to receive the object 720. Such an electrostatic clamp may e.g. comprise one or more electrodes that are covered with an insulating layer.

The stage apparatus 700 according to the present invention further comprises a positioning device 730 for positioning the object table 710. Such a positioning device 730 may e.g. comprises one or more actuators 730.1 or motors for displacing and positioning the object table 710. By means of the positioning device 730, the object table 710 can be positioned with respect to a measurement beam or patterned radiation beam, in case the stage apparatus is applied in an inspection tool or a lithographic apparatus.

In the embodiment as shown, the actuators 730.1 may e.g. be electromagnetic actuators 730.1, similar to the electromagnetic motors 430.1 as discussed above. In the embodiment as shown, the positioning member 730.1 is supported by a support frame 740 of the stage apparatus 700. In an embodiment, the positioning member 730.2 may comprises one or more linear motors and/or planar motors for positioning the object table 710, together with the one or more actuators 730.1, in a similar manner as discussed with reference to FIG. 5. In the embodiment as shown, the stage apparatus 700 according to an embodiment of the present invention further comprises a remote temperature sensor 750 configured to measure a temperature of the object table 710 and/or the object 720. In the embodiment shown in FIG. 10, the remote temperature sensor 750 is configured to measure a temperature of the object table 710. In the embodiment as shown, the temperature sensor 750 comprises a first part 750.1 that is mounted to the object table 710 and a second part 750.2 that is mounted to a metrology frame 800 of the stage apparatus 700. In the embodiment as shown, the stage apparatus comprises a position measurement system 850, in particular an encoder based position measurement system 850 comprising a position target 850.1, e.g. a one or two dimensional grating and a position sensor 850.2, the position sensor 850.2 being configured to determine a relative position of the grating 850.1 and the position sensor 850.1 based on a received reflected measurement beam, indicated by reference number 850.3. In the embodiment as shown, the second part 750.2 of the remote temperature sensor is configured to emit a measurement beam towards the first part 750.1 of the temperature sensor and receive a reflected measurement beam from the first part 750.1 of the temperature sensor. In an embodiment, the first part 750.1 may e.g. comprise a passive temperature sensing element as discussed above. In an embodiment, the second part 750.2 of the remote temperature sensor may e.g. comprise an irradiation source and a detector as discussed above. In the embodiment as shown, the measurement beam and reflected measurement beam, indicated by reference number 750.4, are guided via apertures 730.3 and 730.4 provided in the positioning member 730.2 and a reflective element 730.5, e.g. a mirror.

By means of the mirror 730.5 and apertures 730.3 and 730.4, the second part 750.2 will remain in a line of sight of the first part 750.1 of the temperature sensor, irrespective of the X-position of the positioning member 730.2.

In the embodiment, as shown, the second part 750.2 of the remote temperature sensor, e.g. a detector, may be configured to generate a detector signal, indicated by the dotted line 755, representative of the received reflected measurement light and provide this detector signal 755 to a processing unit 770 configured to process the signal. In FIG. 10, a processing unit 770 is schematically shown, the processing unit 770 having an input terminal 770.1 and an output terminal 770.2. Such a processing unit may be integrated in a control unit of the stage apparatus, or may be a dedicated processing unit for processing the detector signal 755. Such a processing unit 770 may e.g. comprise a processor, microprocessor, computer or the like. Such a processing unit may then e.g. analyse the spectrum of the received detector signal, e.g. received via input terminal 770.1 of the processing unit 770, and determine, based on such analysis, the temperature of the first sensor part 750.1, e.g. a GaAs crystal, and thus the object table or object to which the first sensor part 750.1 is mounted. In such case, the processing unit 770 may be configured to output, e.g. via the output terminal 770.2, a temperature signal 780 representative of the determined temperature.

In the embodiment as shown in FIG. 10, the measurement beam and reflected measurement beam are partially guided through the positioning member 730.2 of the positioning device 730. Alternatively, a horizontally oriented aperture may be provided in the object table towards the first sensor part 750.1, thus creating a line-of sight to the second sensor part 750.2. Such an arrangement is schematically depicted in FIG. 11.

Figure 11:
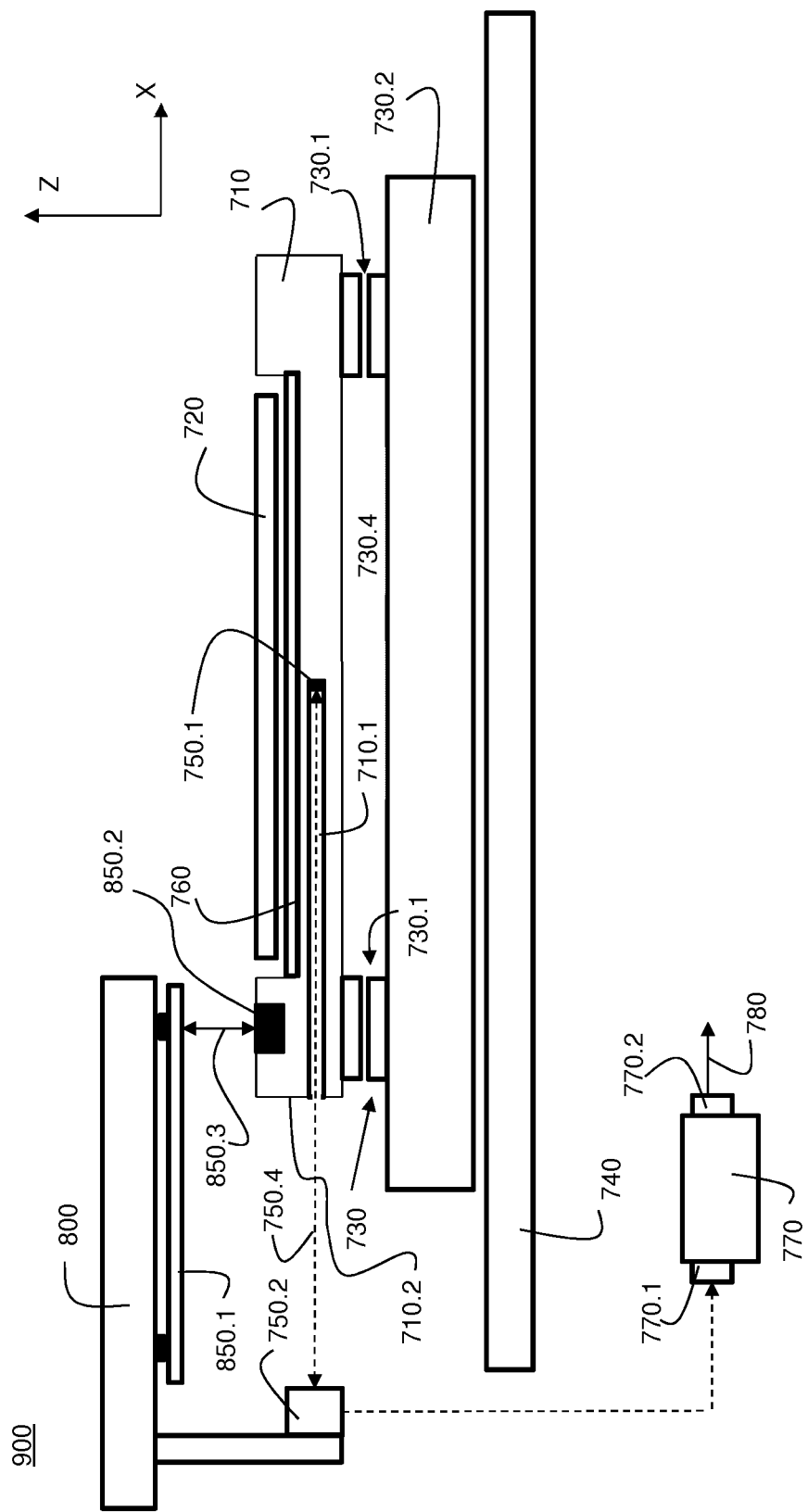
FIG. 11 schematically depicts a third stage apparatus according to the invention.

FIG. 11 schematically depicts a stage apparatus 900 according to the present invention, the stage apparatus 900 being similar to the stage apparatus 700 of FIG. 10, apart from the following: In the embodiment as shown in FIG. 11, the object table 710 comprises an aperture 710.1 via which a measurement beam and a reflected measurement beam, indicated by reference number 750.4, may be provided to and from the first sensor part 750.1, e.g. a GaAs crystal. In a similar manner as discussed with respect to FIG. 10, the aperture 710.1 provides a line-of-sight for the second sensor part 750.2, such that a temperature measurement can be performed, irrespective of an X-position of the object table 710. In an embodiment of the present invention, the passive temperature sensing element 750.1 may also be mounted to a side surface of the object table, e.g. side surface 710.2 of the object table 710. In such an embodiment, the temperature of the object or the temperature at a different location of the object table may e.g. be determined by means of a thermal model of the object table and/or the object, as discussed above.

In an embodiment of the present invention, the remote temperature sensor may comprises a plurality of passive temperature sensing elements, e.g. arranged on the object or object table, or mounted to the object or object table, or arranged in the object or object table, the plurality of passive temperature sensing elements being configured to co-operate with one or more irradiation sources or detectors of the remote temperature sensor. Such an embodiment may e.g. be realised by applying a plurality of remote temperature sensors as e.g. depicted in FIGS. 6 to 11.

In an alternative embodiment, the stage apparatus may apply a plurality of passive temperature sensing elements and one or more source/detector modules, whereby the modules only have a line of sight to the passive temperature sensing elements at discrete positions or a number of position ranges.

Figure 12:
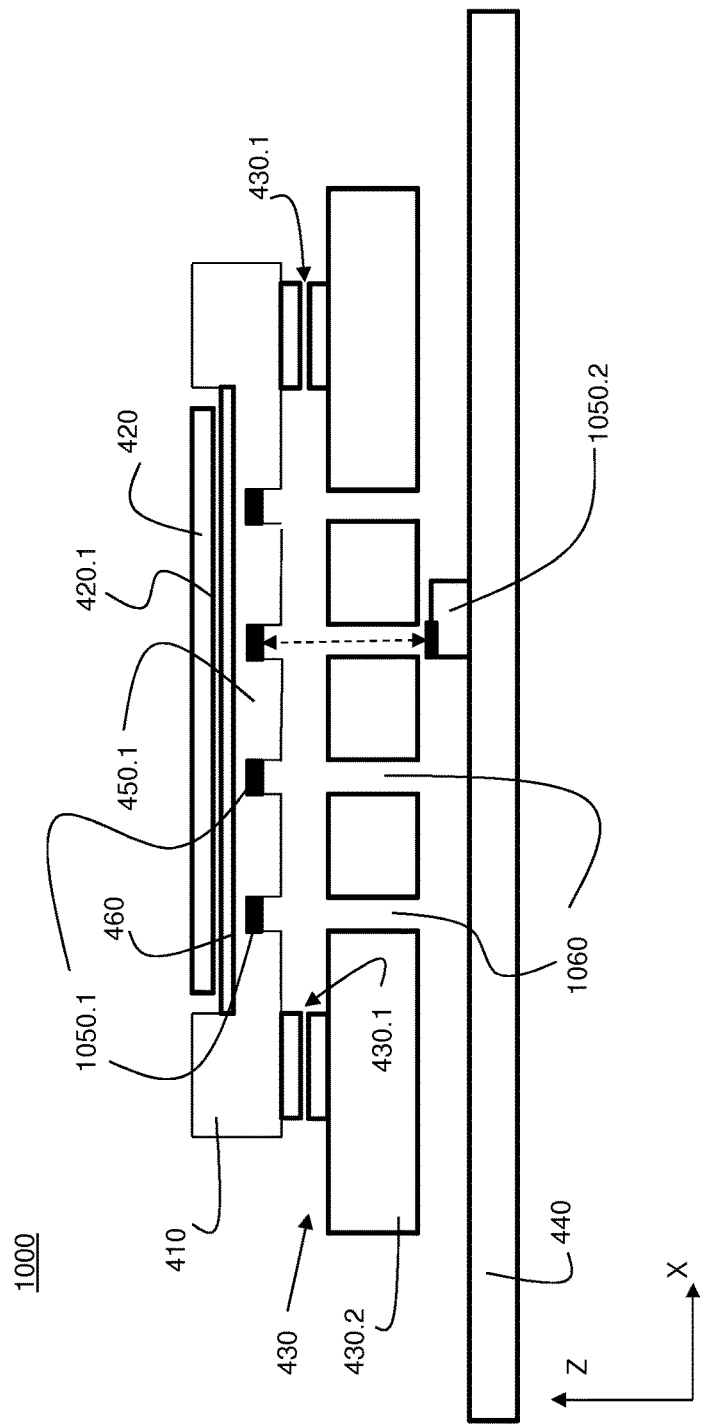
FIG. 12 schematically depicts a fourth stage apparatus according to the invention.

Such an embodiment is schematically shown in FIG. 12. FIG. 12 schematically shows a stage apparatus 1000 according to the present invention, the stage apparatus 1000 comprising an object table 410 that is configured to hold an object 420.

The stage apparatus 400 according to the present invention further comprises a positioning device 430 for positioning the object table 410. Such a positioning device 430 may e.g. comprises one or more actuators 430.1 or motors for displacing and positioning the object table 410. By means of the positioning device 430, the object table 410 can be positioned with respect to a measurement beam or patterned radiation beam, in case the stage apparatus is applied in an inspection tool or a lithographic apparatus.

In the embodiment as shown, the actuators 430.1 and the object table 410 are mounted to a positioning member 430.2 which may e.g. comprises one or more one or more linear motors and/or planar motors for positioning the object table 410, together with the one or more actuators 430.1. In such an embodiment, the positioning device 430 thus comprises a first positioning device, e.g. actuators 430.1, that is configured to position the object table 410 and a second positioning device, e.g. positioning member 430.2, that is configured to position the first positioning device and the object table 410. In such a two-stage or cascaded positioning device, the first positioning device may e.g. be configured to position the object table over a comparatively small range, relative to the second positioning device, whereas the second positioning device may e.g. be configured to position the first positioning device and the object table 410, over a comparatively large range. Typically, the comparatively small range may e.g. be ~1 to 5 mm, whereas the comparatively large range may e.g. be ~300 mm or larger. In the embodiment as shown, the positioning member 430.2 is supported by a support frame 440 of the stage apparatus 1000.

When performing a measurement process or an exposure process, it is desirable to have information regarding a temperature of the object that is processed. In order to accommodate this, the stage apparatus according to the present invention, e.g. stage apparatus 1000, further comprises a remote temperature sensor 1050 configured to measure a temperature of the object table 410 and/or the object 420. In the embodiment shown in FIG. 12, the remote temperature sensor 1050 is configured to measure a temperature of the object table 410. In the embodiment as shown, the temperature sensor 1050 comprises a first part 1050.1 that is mounted to the object table 410 and a second part 1050.2 that is mounted to the support frame 440. In the embodiment as shown, the first part 450.1 of the temperature sensor 450 comprises 4 passive temperature sensing element 1050.1 mounted in protrusions of the object table 410. In the embodiment as shown, the second temperature sensor part 1050.2 is mounted to the support frame 440 and comprises a source/detector module or unit as described above. In the embodiment as shown, the position member 430.2 comprises 4 through holes 1060 which provide, for a given discrete X-positions or number of ranges in the X-direction, a line of sight, e.g. indicated by the dotted line 1070, from one of the passive temperature sensing elements 1050.1 to the second temperature sensor part 1050.2, thereby enabling to determine the temperature of a particular passive temperature sensing element, i.e. a temperature of a particular location on the object table 410. When the object table 410 moves, together with the positioning member 430.2 in the X-direction, a line-of-sight will become available between the second temperature sensor part 1050.2 and a next passive temperature sensing element 1050.1, enabling to determine the temperature of a different location on the object table 410.

In yet another embodiment of the present invention, the second temperature sensor part 1050.2 may be mounted to the support frame and may comprise an optical fiber or the like that is connected to the position member 430.2. in such embodiment, the optical fiber may be arranged to provide a measurement beam to the object table 410 and receive a reflected measurement beam from the object table, in a similar manner as depicted in FIG. 5a, 6, 7 or 8a-8c.

In the embodiments of the present invention as shown above, the passive temperature sensing element has been shown at a location below the clamp of the object table, e.g. clamp 460, 560 or 760. In an embodiment of the present invention, the passive temperature element may also be mounted to a surface of the clamp, e.g. an electrostatic clamp. By doing so, an even more accurate determination of the temperature of the object may be realised, because the close vicinity of the clamp to the object. In such embodiment, the passive temperature sensing element may be mounted to an outer surface of the clamp, or may be mounted in an aperture of the clamp.

As will be understood by the skilled person, the various features as disclosed in the various embodiments of the stage apparatus described above may advantageously be combined in other embodiments. As an example, the use of optical fibers as described in FIGS. 6 to 8 may also be implemented in other embodiments of the stage apparatus according to the invention, in order to propagate a measurement beam and or a reflected measurement beam from one location to another. As another example, the use of lens-shaped surfaces or lenses or mirrors as described in the embodiments of FIGS. 8 and 10 may also be applied in other embodiment of the stage apparatus according to the present invention, in order to provide a suitable line-of-sight between the first sensor part and the second sensor part, e.g. between a passive temperature sensing element and a source/detector module or unit of the remote temperature sensor as applied.

In an embodiment of the present invention, the remote temperature sensor comprises a contactless temperature sensor. Such a contactless temperature sensor does not require the application of a passive temperature sensing element as discussed above. Rather, the temperature sensing or determination may be based on received radiation emitted by the object or the object table. In such embodiment, the contactless temperature sensor may e.g. comprises an infrared (IR) detector. Such an infrared detector may be located at various locations, e.g. the locations of the second sensor part as describe above. In such embodiment, in a similar manner as described above, measures may be taken to ensure that the infrared detector has a line-of-sight towards the object or object table. In such embodiment, there is no need to apply an irradiation source, rather the IR radiation as emitted by the object or object table is applied as a measure for the temperature of the object or object table. Alternatively, the contactless temperature sensor as applied may be configured to emit a measurement beam towards the object or object table, in particular towards a surface of the object or object table and receive a reflected measurement beam from said surface and determine a temperature of the surface, based on the received reflected measurement beam. In such embodiment, the measurement beam is thus directly applied to a surface of the object or the object table, without the application of a passive temperature sensing element.

In such embodiment, the stage apparatus according to the invention may be configured to provide a line-of-sight from a surface of the object and/or object table towards the contactless temperature sensor.

In an embodiment, stage apparatus 400 further comprises an optical fiber temperature sensor configured to measure a temperature of the object table 410 and/or the object 420 with/without the remote temperature sensor. A sensing element of the optical fiber temperature sensor may be arranged on or in the object table 410. The sensing element of the optical fiber temperature sensor may be arranged on or in the object table 410 near or at the object 420 or the electrostatic clamp 460.

Further embodiments may be described in the following clauses:

1. Stage apparatus comprising:
   an object table configured to hold an object;
   a positioning device configured to position the object table;
   a remote temperature sensor configured to measure a temperature of the object table and/or the object.
2. The stage apparatus according to clause 1, wherein the object table comprises an electrostatic clamp configured to clamp the object to the object table.
3. The stage apparatus according to clause 1 or 2, wherein the stage apparatus further comprises a voltage supply configured to apply a voltage to the object.
4. The stage apparatus according to clause 3, wherein the voltage is a negative voltage.
5. The stage apparatus according to any of the clauses 1 to 4, wherein the positioning device comprises a first positioning device for positioning the object table and a second positioning device for positioning the first positioning device.
6. The stage apparatus according to clause 5, wherein the first positioning device has a higher positioning accuracy and/or precision than the second positioning device.
7. The stage apparatus according to clause 5 or 6, wherein the first positioning device comprises one or more electromagnetic and/or piezo-electrical actuators.
8. The stage apparatus according to any of the clause 5 to 7, wherein the second positioning device comprises one or more linear motors and/or planar motors.
9. The stage apparatus according to any of the clauses 1 to 8, wherein the remote temperature sensor comprises a passive temperature sensing element.
10. The stage apparatus according to clause 9, wherein the passive temperature sensing element is mounted to the object table.
11. The stage apparatus according to clause 9, wherein the object table comprises an electrostatic clamp configured to clamp the object to the object table and wherein the passive temperature sensing element is mounted to the electrostatic clamp.
12. The stage apparatus according to clause 9, 10 or 11, wherein the remote temperature sensor comprises:

an irradiation source configured to irradiate the passive temperature sensing element with a measurement beam, and a detector configured to receive a reflected measurement beam from the passive temperature sensing element.

13. The stage apparatus according to clause 12, wherein the irradiation source and/or the detector are mounted to a frame of the apparatus.

14. The stage apparatus according to clause 12, wherein the positioning device comprises a first positioning device for positioning the object table and a second positioning device for positioning the first positioning device, and wherein the irradiation source and/or the detector are mounted to the second positioning device.

15. The stage apparatus according to clause 13, wherein the frame comprises a support frame configured to support the positioning device.

16. The stage apparatus according to clause 13, wherein the frame comprises a metrology frame.

17. The stage apparatus according to clause 16, further comprising a position measurement system that is configured to measure a position of the object table.

18. The stage apparatus according to clause 17, wherein the position measurement system comprises a position sensor and a position target and wherein one of the position sensor and the position target is mounted to the object table and the other of the position sensor and the position target is mounted to the metrology frame.

19. The stage apparatus according to any of the clauses 12 to 18, wherein the detector is configured to generate a detector signal representative of the received reflected measurement beam, and wherein the stage apparatus further comprises a processing unit configured to receive the detector signal and determine a temperature of the object table, based on the detector signal.

20. The stage apparatus according to clause 19, wherein the processing unit is configured to output a temperature signal representative of the temperature of the object table.

21. The stage apparatus according to clause 19 or 20, wherein the processing unit comprises a thermal model of the object table and/or the object and is configured to determine a temperature of the object table and/or the object based on the detector signal and the thermal model.

22. The stage apparatus according to any of clauses 1 to 18, wherein the stage apparatus further comprises a processing unit comprising a thermal model of the object table and/or the object, and wherein the processing unit is configured to determine a temperature of the object table and/or the object based on a measurement of the remote temperature sensor and the thermal model.

23. The stage apparatus according to any of the clauses 12 to 21, whereby at least part of an optical path of the measurement beam and/or the reflected measurement beam is formed by a non-solid material.

24. The stage apparatus according to clause 23, whereby the at least part of the optical path is formed by a gas or vacuum.

25. The stage apparatus according to clause 23 or 24, wherein the optical path of the measurement beam and/or the reflected measurement beam passes via an optical element.

26. The stage apparatus according to clause 25, wherein the optical element comprises a lens, a lens shaped surface or a mirror.

27. The stage apparatus according to any of the clauses 9 to 21 or clauses 23 to 26, wherein the passive temperature sensing element comprises GaAs.

28. The stage apparatus according to any of the clauses 9 to 21 or clauses 23 to 27, wherein the passive temperature sensing element has a temperature dependent reflectivity and/or a temperature dependent absorption rate.

29. The stage apparatus according to any of the clauses 9 to 21 or clauses 23 to 28, wherein an intensity of a frequency component of the reflected measurement beam is temperature dependent.

30. The stage apparatus according to clause 28 or 29, wherein a ratio of an intensity of a first frequency or frequency range of the reflected measurement beam to an intensity of a second frequency or frequency range of the reflected measurement beam is temperature dependent.

31. The stage apparatus according to any of the clauses 9 to 21 or clauses 23 to 30, comprising multiple passive temperature sensing elements that are mounted to the object table.

32. Stage apparatus comprising:
an object table configured to hold an object;
a positioning device configured to position the object table;
an optical fiber temperature sensor configured to measure a temperature of the object table and/or the object.

33. The inspection tool comprising a stage apparatus according to any of the preceding clauses.

34. The inspection tool according clause 33, further comprising a charged particle beam source configured to generate a charged particle beam.

35. The inspection tool according to clause 34, further comprising a projection system for projecting the charged particle beam onto the object.

36. A particle beam apparatus comprising a stage apparatus according to any of the clauses 1 to 32.

37. The particle beam apparatus according to clause 36, wherein the particle beam apparatus is a particle beam inspection apparatus.

38. A lithography apparatus comprising a stage apparatus according to any of the clauses 1 to 32.

39. A metrology apparatus comprising a stage apparatus according to any of the clauses 1 to 32.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin film magnetic heads, etc. In other examples, the lithographic apparatus may provide the pattern on the substrate using electron beam, x-ray or nano-imprint lithography. That is, the lithographic apparatus may be an electron beam, x-ray or nano-imprint apparatus.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Although specific reference may be made in this text to embodiments of the invention in the context of an inspection apparatus, the object table may be suitable for use in: an electron beam apparatus, a scanning electron microscope, an electron beam direct writer, an electron beam projection lithography apparatus, an electron beam inspection apparatus, an electron beam defect verification apparatus, or an electron beam metrology apparatus.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

What is claimed is:

1. A stage apparatus comprising:
   an object table configured to hold an object;
   a positioning device configured to position the object table;
   a remote temperature sensor configured to measure a temperature of the object table and/or the object; and
   a passive temperature sensing element,
   wherein the remote temperature sensor comprises an input surface to receive radiation from the passive temperature sensing element, and
   wherein the object table and the input surface are configured to enable relative movement between the passive temperature sensing element and the input surface.

2. The stage apparatus according to claim 1, wherein the passive temperature sensing element is mounted to the object table.

3. The stage apparatus according to claim 1, wherein the remote temperature sensor comprises:

an irradiation source configured to irradiate the passive temperature sensing element with a measurement beam, and
   a detector configured to receive a reflected measurement beam from the passive temperature sensing element.

4. The stage apparatus according to claim 3, wherein the positioning device comprises a first positioning device configured to position the object table and a second positioning device configured to position the first positioning device, and wherein the irradiation source and/or the detector are mounted to the second positioning device.

5. The stage apparatus according to claim 1, wherein the stage apparatus further comprises a voltage supply configured to apply a voltage to the object.

6. The stage apparatus according to claim 5, wherein the voltage is a negative voltage.

7. The stage apparatus according to claim 1, wherein the positioning device comprises a first positioning device configured to position the object table and a second positioning device configured to position the first positioning device.

8. The stage apparatus according to claim 1, further comprising a processing unit comprising a thermal model of the object table and/or the object, the processing unit configured to determine a temperature of the object table and/or the object based on a measurement of the remote temperature sensor and the thermal model.

9. The stage apparatus according to claim 3, wherein at least part of an optical path of the measurement beam and/or the reflected measurement beam is formed by a non-solid material.

10. The stage apparatus according to claim 9, wherein the at least part of the optical path is formed by a gas or vacuum.

11. The stage apparatus according to claim 9, wherein the optical path of the measurement beam and/or the reflected measurement beam passes via an optical element.

12. The stage apparatus according to claim 1, wherein the passive temperature sensing element comprises GaAs.

13. The stage apparatus according to claim 3, wherein an intensity of a frequency component of the reflected measurement beam is temperature dependent.

14. The stage apparatus according to claim 1, comprising multiple passive temperature sensing elements that are mounted to the object table.

15. A system comprising the stage apparatus according to claim 1, wherein the system is a particle beam apparatus, an electron beam apparatus, a scanning electron microscope, an electron beam direct writer, an electron beam projection lithography apparatus, an electron beam inspection apparatus, an electron beam defect verification apparatus, an electron beam metrology apparatus, a lithographic apparatus, or a metrology apparatus.

16. The stage apparatus according to claim 3, wherein the detector is configured to generate a detector signal representative of the received reflected measurement beam, and the stage apparatus further comprises a processing unit configured to receive the detector signal and determine, based on the detector signal, a temperature of the object table.

17. The stage apparatus according to claim 4, wherein the first positioning device has a higher positioning accuracy and/or precision than the second positioning device.

18. The stage apparatus according to claim 3, wherein a ratio of an intensity of a first frequency or frequency range of the reflected measurement beam to an intensity of a second frequency or frequency range of the reflected measurement beam is temperature dependent.

19. The stage apparatus according to claim 1, wherein the passive temperature sensing element has a temperature dependent reflectivity and/or a temperature dependent absorption rate.

20. The stage apparatus according to claim 1, wherein the object table comprises an electrostatic clamp configured to clamp the object to the object table.

* * * * *